United States Patent
Pious et al.

(10) Patent No.: US 8,526,253 B2
(45) Date of Patent: Sep. 3, 2013

(54) METHOD OF SCREENING STATIC RANDOM ACCESS MEMORIES FOR PASS TRANSISTOR DEFECTS

(75) Inventors: Beena Pious, Carrollton, TX (US); Jayesh C. Raval, Allen, TX (US); Wah Kit Loh, Richardson, TX (US); Stanton Petree Ashburn, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 13/220,104

(22) Filed: Aug. 29, 2011

(65) Prior Publication Data
US 2013/0051169 A1    Feb. 28, 2013

(51) Int. Cl.
*G11C 29/00*    (2006.01)
*G11C 29/50*    (2006.01)

(52) U.S. Cl.
CPC ........................... *G11C 29/50* (2013.01)
USPC . 365/201; 365/154; 365/189.04; 365/189.09; 365/104; 365/226

(58) Field of Classification Search
CPC ........ G05F 1/465; G05F 3/262; G11C 11/417
USPC ........... 365/201, 154, 196, 203, 207, 189.09, 365/104, 226
See application file for complete search history.

(56) References Cited

U.S. PATENT DOCUMENTS 7,088,607 B2    8/2006    Matsuzawa et al.
2013/0028036 A1*  1/2013    Deng et al. ............... 365/201

OTHER PUBLICATIONS

Guo et al., "Large-Scale Read/Write Margin Measurement in 45nm CMOS SRAM Arrays", Digest of Tech. Papers, 2008 Symp. on VLSI Circuits (IEEE, 2008), pp. 42-43.

* cited by examiner

*Primary Examiner* — Thong Q Le
(74) *Attorney, Agent, or Firm* — Rose Alyssa Keagy; W. James Brady; Frederick J. Telecky, Jr.

(57) ABSTRACT

A method of screening static random access memory (SRAM) arrays to identify memory cells with bit line side pass transistor defects. After writing a known data state to the memory cells under test, a forward back-bias is applied to the load transistors of those cells. A write of the opposite data state is then performed, followed by a read of the memory cells. The process is repeated for the opposite data state.

20 Claims, 6 Drawing Sheets

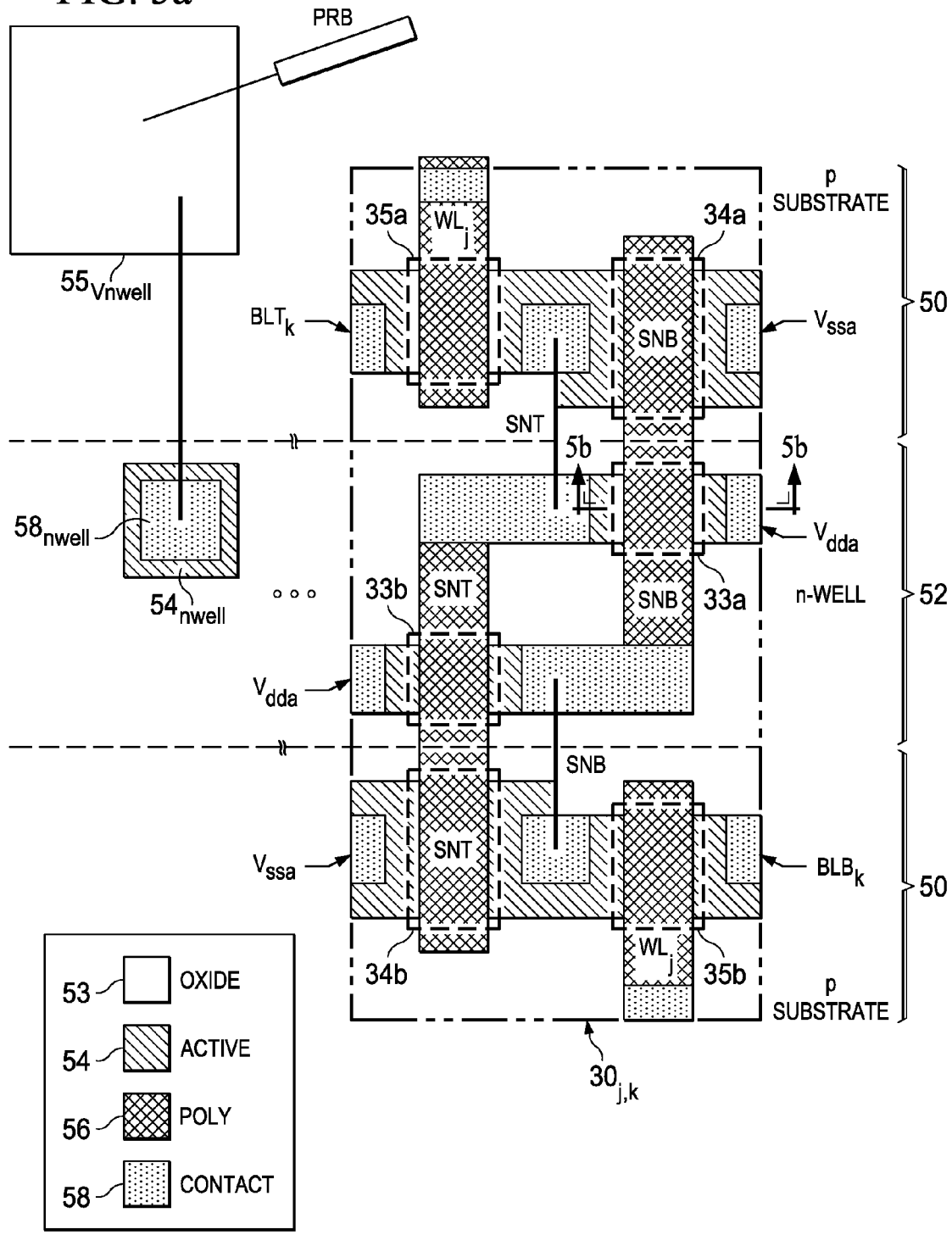

METHOD OF SCREENING STATIC RANDOM ACCESS MEMORIES FOR PASS TRANSISTOR DEFECTS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

An example of a conventional SRAM cell is shown in FIG. 1a. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel MOS load transistor 3a and n-channel MOS driver transistor 4a, and the other inverter of series-connected p-channel MOS load transistor 3b and n-channel MOS transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel MOS pass-gate transistor 5a has its source/drain path connected between storage node SNT and bit line $BLT_k$ for the $k^{th}$ column, and n-channel MOS pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

The body nodes of p-channel transistors 3a, 3b are typically connected to power supply voltage $V_{dda}$ (by way of an n-well connection), and the body nodes of n-channel transistors 4a, 4b, 5a, 5b are typically connected to ground voltage $V_{ssa}$ (by way of a p-well connection). This condition, in which the voltage difference between the body nodes and source nodes of the transistors in memory cell 2 is zero, is commonly referred to as the "zero back-bias" or "normal back-bias" condition.

In operation, bit lines $BLT_k$, $BLB_k$ are typically precharged to a high voltage (at or near power supply voltage $V_{dda}$), and are equalized to the same voltage. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

One type of SRAM functional failure is referred to as a cell stability failure. In general, a cell stability failure occurs if noise of sufficient magnitude couples to the bit lines of unselected cells, for example during a write to a selected memory cell in the same row, to cause a false write of data to unselected cells in that same row. In effect, such write cycle noise can be of sufficient magnitude as to trip the inverters of one or more of the unselected cells (i.e., the "half-selected" cells in unselected columns of the selected row). The possibility of such a cell stability failure is exacerbated by device mismatch and variability, as discussed above.

Write failures are the converse of cell stability failures—while a cell stability failure occurs if a cell changes its state too easily, a write failure occurs if an addressed cell is stubborn to being written with the opposite data state. In general, write failures are due to the inability of write circuitry to pull down the storage node currently latched to a high voltage. For example, if cell 2 is storing a "1" state (its load transistor 3a on, and driver transistor 4a off), an attempt to write a low logic level to storage node SNT will fail if bit line BLT$_k$ is unable to sufficiently discharge storage node SNT to a sufficient level to trip the inverters. As such, SRAM write failures occur if the drive of the pass transistor is sufficiently weak, relative to the drive of the p-channel load transistor pulling up the storage node to be written.

Conventional manufacturing tests of SRAMs include various tests of the writeability of each memory cell. These writeability tests amount to the writing of both data states "0" and "1" over the previously stored opposite data states, followed by reads of the newly written data state, under one or more bias conditions intended to screen out those SRAM cells with weak "write margin". Conventional write margin measurements include sweeping the low side bit line voltage above ground; sweeping the word line voltage below the power supply voltage V$_{dda}$; measuring the write current on the low side bit line; and characterizing the write noise margin corresponding to the well-known "butterfly" curve. Manufacturing test conditions are typically derived based on these measurements for each particular SRAM design, and can include some sort of "guardband" in which one or more of the relevant operating voltages is set at a harsher voltage than in normal operation (e.g., low side bit line voltage during write may be held at a selected voltage above ground), thus screening out those SRAM cells with weak write margin. Those weak cells may be replaced by conventional redundancy techniques, or the memory itself may be considered as failed.

Accelerated operating life test of certain integrated circuits have exhibited early life failures appearing as write failures to one or more SRAM cells. These SRAM cells had previously successfully passed the conventional write margin screening. Failure analysis indicated that many of these write failure cells exhibit manufacturing defects on the "bit line side" of the pass transistors, resulting in asymmetry in those cells. One particular type of defect causing such failures appeared as a missing lightly-doped drain extension on that side of the transistor; other manufacturing defects were similarly observed as causing such asymmetry.

FIG. 1b illustrates an example of the electrical effect of such a bit line side defect in an instance of SRAM cell 2. In this example, pass transistor 5a, coupled between storage node SNT and bit line BLT$_k$ exhibits this type of defect, for example as corresponding to a missing drain extension on the side of pass transistor 5a electrically closest to bit line BLT$_k$. In that case, as in the case of other similarly-behaving defects, the conduction path between the channel of transistor 5a (when on) and bit line BLT$_k$ is more resistive than normal, as exhibited by resistor 5R$_{ds}$ in FIG. 1b. It has been observed, in connection with this invention, that the effective resistance of resistor 5R$_{ds}$ can be on the order of 10 to 50 kΩ. This resistance reduces the ability of bit line BLT$_k$ and pass transistor 5a to pull storage node SNT sufficiently low to trip the state of the cell.

Because of the bit line side location of this defect, conventional manufacturing "time zero" screens have not effectively screened out these marginal cells. However, it has been observed that even modest degradation of the cell transistors in accelerated operating life test (or burn-in, as the case may be) shifts the write performance enough to cause early life write failures in a number of devices. It is believed that the degradation mechanism resulting in these failures is channel hot carrier shifts.

By way of further background, it is known in the art to apply a voltage higher than power supply voltage V$_{dda}$ to the body nodes of p-channel load transistors 3a, 3b (e.g., to the n-well in which transistors 3a, 3b are formed) during the test of memory arrays including SRAM cell 2 of FIG. 1a. This condition is referred to in the art as a "reverse back-bias" condition. As fundamental in the art, this reverse back-bias voltage has the effect of increasing the threshold voltage of those transistors 3a, 3b, and thus reducing their source-drain drive at a given source-drain voltage and gate-source voltage. Such a test is performed with the intent of screening out cells 2 that are vulnerable to negative bias temperature instability ("NBTI"), which appears as an increase in threshold voltage over operating time.

By way of further background, it is known in the art to decrease the body node bias (i.e., n-well voltage) below the source voltage of p-channel transistors in logic circuits, to reduce the threshold voltage of those transistors and accordingly increase the switching performance in critical logic paths of those integrated circuits. This condition is referred to in the art as the "forward back-bias condition". Typically, this forward back-bias is enabled after packaging of the integrated circuit.

BRIEF SUMMARY OF THE INVENTION

Embodiments of this invention provide a method of screening integrated circuits including memory arrays, at manufacture, to identify memory cells and arrays that are vulnerable to early life write failures.

Embodiments of this invention provide such a method that efficiently distinguishes the vulnerable cells from good memory cells, without the yield loss due to over-screening.

Embodiments of this invention provide such a method that enables the use of redundancy techniques to replace memory cells identified as vulnerable to early life failure.

Other advantages of embodiments of this invention will be apparent to those of ordinary skill in the art having reference to the following specification together with its drawings.

Embodiments of this invention may be implemented into an automated test program or sequence, for testing a population of CMOS memory cells constructed as cross-coupled inverters. Functionality of the memory cells is confirmed by conventional functional testing under normal operating conditions, as may be guardbanded. A known data state is then written to each memory cell in the population. The back-bias of the load transistors in the cross-coupled inverters is then modulated to a forward back-bias condition; for example, this forward back-bias is accomplished by lowering the n-well voltage for the p-channel load transistors of CMOS cells to a voltage below the power supply voltage at the load transistor source nodes. Writing of the opposite state is then performed under this bias, followed by reads of the written data state under normal bias (or still under forward back-bias, if reads are not affected by that bias condition). The sequence is repeated for the opposite data state. For memories tested in this manner in wafer form, those memory cells identified as failing the write test under forward back-bias can then be replaced by enabling redundant rows or columns, if available.

BRIEF DESCRIPTION OF THE SEVERAL VIEWS OF THE DRAWING

FIG. 5a is a plan view, in layout form, of the SRAM cell of FIG. 4, according to an embodiment of the invention.

FIG. 5b is a cross-sectional view of one of the load transistors in the SRAM cell of FIG. 5a.

DETAILED DESCRIPTION OF THE INVENTION

This invention will be described in connection with certain embodiments, namely as implemented into a method of testing static random access memories, because it is contemplated that this invention will be especially beneficial when used in such an application. However, it is also contemplated that this invention will also be beneficial if applied to memories of other types, and to stand-alone and embedded memories in integrated circuits of various architectures. Accordingly, it is to be understood that the following description is provided by way of example only, and is not intended to limit the true scope of this invention as claimed.

Figure 2:
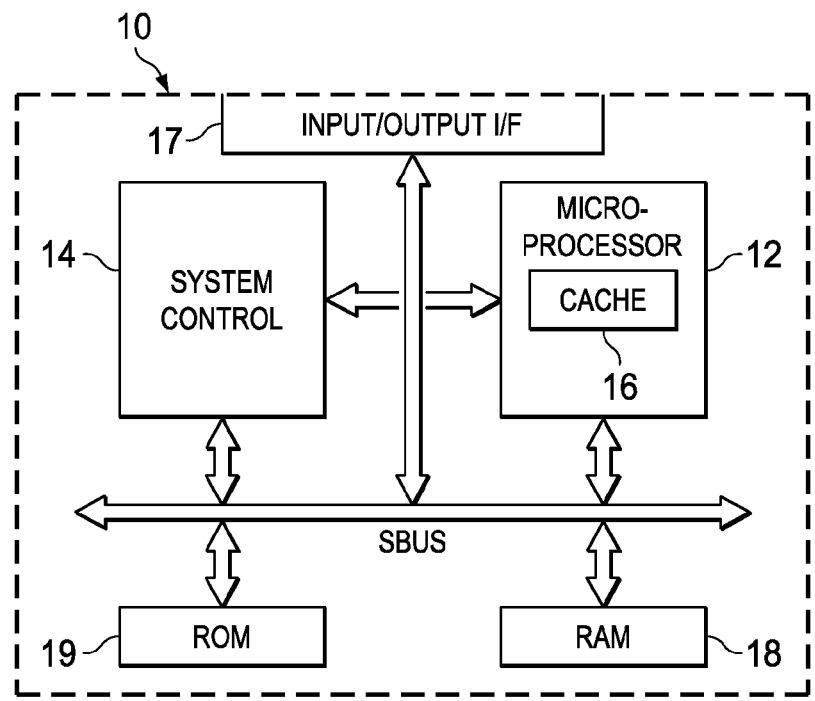
FIG. 2 is an electrical diagram, in block form, of a large-scale integrated circuit in which memory resources are implemented, and to which embodiments of the invention are applied.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. Typically, ROM 19 serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Figure 3:
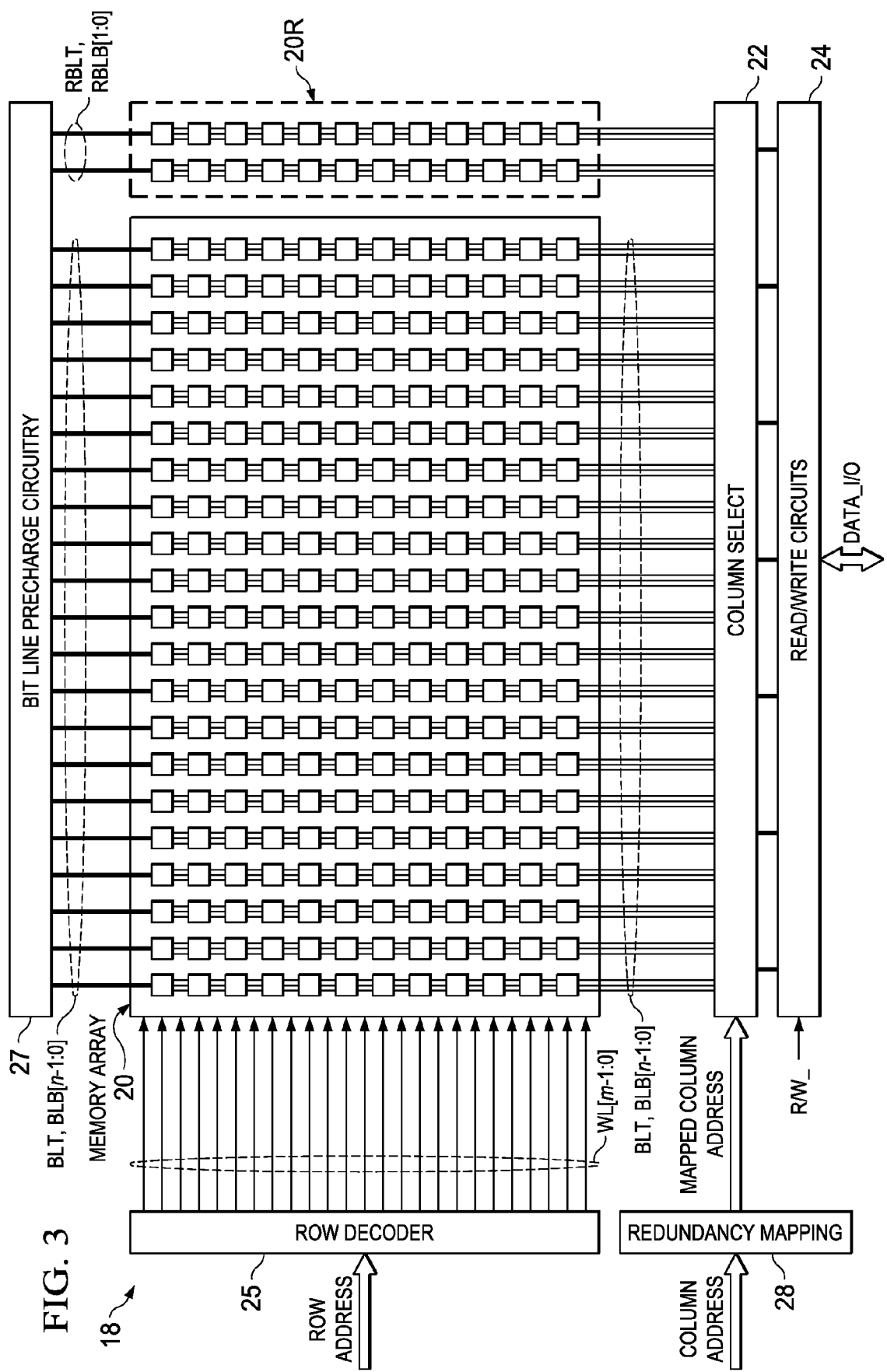
FIG. 3 is an electrical diagram, in block form, of a random access memory in the integrated circuit of FIG. 2, to which embodiments of the invention are applied.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18. The construction of these memory cells according to embodiments of this invention will be described in further detail below. In this example, memory array 20 includes m rows and n columns of SRAM cells, with cells in the same column sharing a pair of bit lines BLT[n-1:0], BLB[n-1:0], and with memory cells in the same row sharing one of word lines WL[m-1:0]. Bit line precharge circuitry 27 is provided to apply a desired precharge voltage to the pairs of bit lines BLT[n-1:0], BLB[n-1:0] in advance of read and write operations. Row decoder 25 receives a row address value indicating the row of memory array 20 to be accessed, and energizes the one of word lines WL[m-1:0] corresponding to that row address value. Column select circuit 22 receives a column address value, and in response selects pairs of bit lines BLT[n-1:0], BLB[n-1:0] associated with one or more columns to be placed in communication with read/write circuits 24. Read/write circuits 24 are constructed in the conventional manner, for example to include the typical differential amplifier coupled to the bit lines for a column as selected by column select circuit 22 and a write circuit for selectively pulling toward ground one of the bit lines in the selected pair.

As is common in the art, redundant array 20R is provided in this example of RAM 18, to allow replacement of memory cells within array 20 that are found to be defective. In this example, redundant array 20R includes two columns of memory cells, associated with the appropriate one of bit line pairs RBLT, RBLB[1:0] connected to bit line precharge circuitry 27 on one side of redundant array 20R, and to column select circuit 22 on the other side. Each column of memory cells within redundant array 20R includes one memory cell in each of the rows within array 20, those cells receiving the same word lines WL[m-1:0] as cells within array 20 in the same rows. RAM 18 also includes redundancy mapping circuit 28, which provides mapping between a received memory address and a selected memory cell (i.e., row, column or both) within redundant array 20R, according to mapping indicated by fuses, programmed non-volatile register bits or memory cells, or the like within redundancy mapping circuit 35. As known in the art, the setting of such mapping in redundancy mapping circuit 35 is typically performed during the manufacturing test process, upon such testing identifying one or more defective or weak memory cells within array 20.

While RAM 18 includes two redundant columns of memory cells within redundant array 20R, more or fewer columns of memory cells may of course be provided within redundant array 20R. Alternatively, or in addition, to redundant columns, the architecture of RAM 18 may provide one or more redundant rows of memory cells. In the example of FIG. 3, redundant mapping circuit 35 is placed within RAM 18 within the path of the received column address, forwarding a re-mapped column address to column select circuit 22 when enabled. It is contemplated that redundant mapping circuitry 35 would of course be arranged to re-map row addresses, or both row and column addresses, depending on the arrangement of redundant array 20R. And while redundant mapping circuit 35 is shown as a separate function in the architecture of FIG. 3, it is contemplated that redundant mapping circuit 35 will typically be included or integrated within the address decoding circuitry of RAM 18 as appropriate for the arrangement of redundant array 20R.

Figure 4:
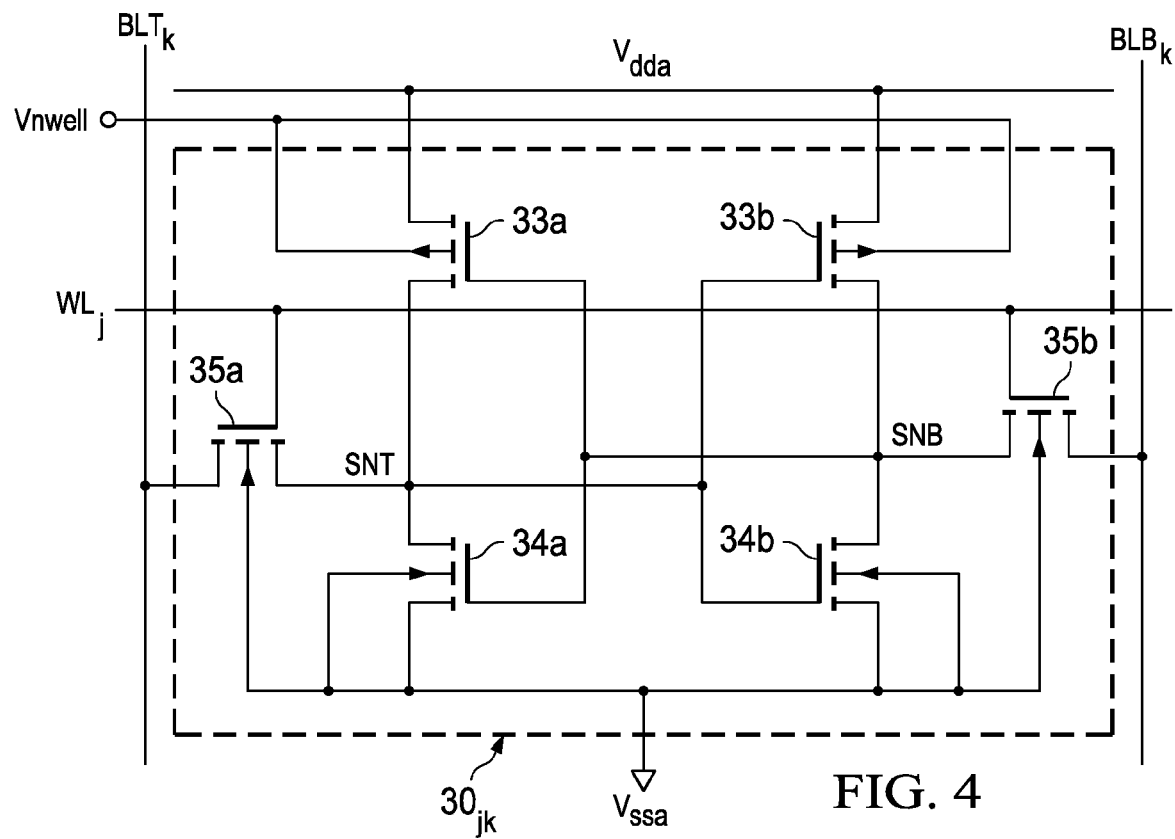
FIG. 4 is an electrical diagram, in schematic form, of an SRAM cell in the memory of FIG. 3, illustrating the body node bias connection as used according to embodiments of the invention.

FIG. 4 illustrates the arrangement of memory cell $30_{jk}$ in array 20 (and redundant array 20R, as the case may be) in RAM 18. The construction and operation of memory cell $30_{jk}$ corresponds to that of a conventional six-transistor (6-T) static memory cell, for example as described above in connection with FIG. 1a. Alternatively, the memory cells of RAM 18 may be constructed in other arrangements, including other types of SRAM cells (8-T, 10-T, etc.), as a single-ended latch (i.e., a single inverter driving a bit line via a pass transistor), etc. In this case, memory cell $30_{jk}$ is constructed in the conventional manner as a pair of cross-coupled CMOS inverters, one inverter of series-connected p-channel MOS load transistor 33a and n-channel MOS driver transistor 34a, and the other inverter of series-connected p-channel MOS load transistor 33b and re-channel MOS transistor 34b, both inverters biased between power supply voltage $V_{dda}$ and reference (ground) voltage $V_{ssa}$. Similarly as described above, the gates of transistors 33a, 34a of one inverter are connected together and to the common drain node of transistors 33b, 34b in the other inverter, at storage node SNB; conversely, the gates of transistors 33b, 34b are connected together and to the common drain node of transistors 33a, 34a at storage node SNT. Cell $30_{jk}$ is in the $j^{th}$ row and $l^{th}$ column of memory array 20. As such, n-channel MOS pass-gate transistor 35a has its source/drain path connected between storage node SNT and bit line $BLT_k$ for the $k^{th}$ column, and n-channel MOS pass-gate transistor 35b has its source/drain path connected between storage node SNB and bit line $BLB_k$. The gates of pass-gate transistors 5a, 5b are driven by word line $WL_j$ for this $j^{th}$ row in which cell $30_{jk}$ resides.

Figure 1A:
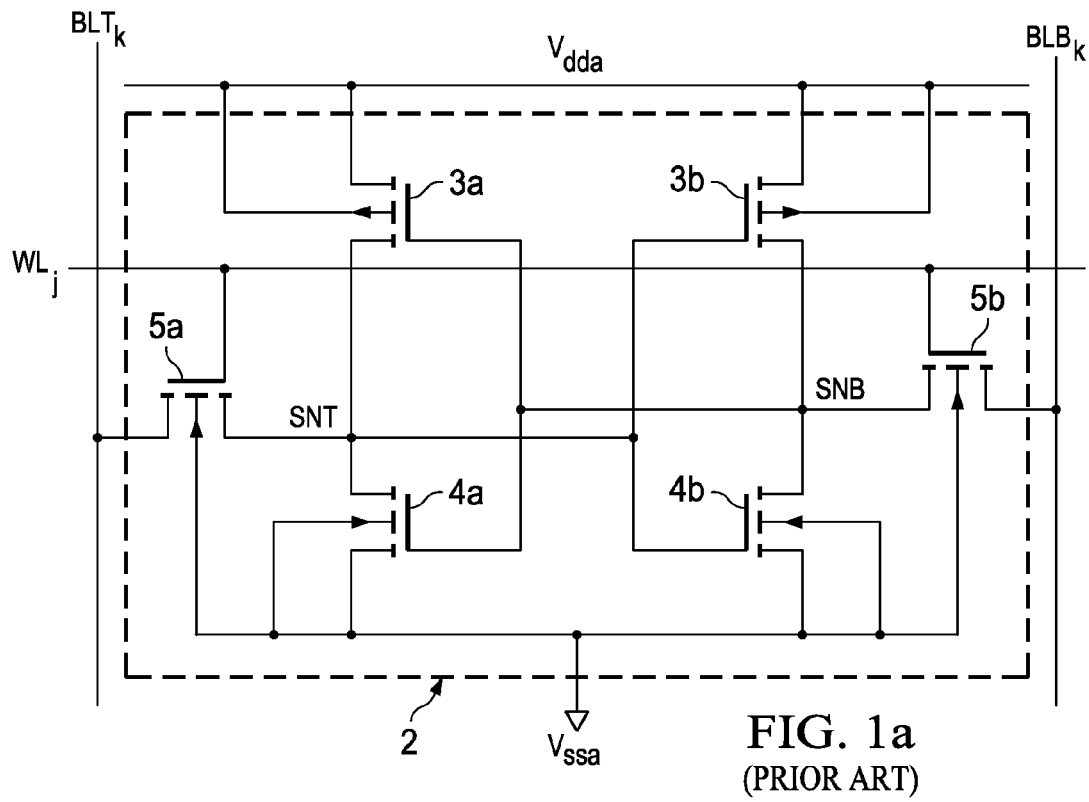
FIG. 1a is an electrical diagram, in schematic form, of a conventional six-transistor (6-T) static random access memory (SRAM) cell.

In cell $30_{jk}$ as shown in FIG. 4, according to embodiments of this invention, the body nodes of p-channel transistors 33a, 33b are electrically connected to a separate voltage node $V_{nwell}$, rather than to power supply voltage $V_{dda}$ as in the case of cell 2 of FIG. 1a. This separate electrical connection allows the body node voltage of these transistors 33a, 33b to differ from the voltage at the sources of transistors 33a, 33b (i.e., differ from power supply voltage $V_{dda}$). This ability to separately back-bias these p-channel MOS load transistors 33a, 33b is utilized in connection with embodiments of the invention, as will be described below.

As known in the art of conventional CMOS technology, MOS transistors are commonly formed within "wells", which are doped regions at the semiconducting surface of the wafer substrate into which transistors of the opposite conductivity type are formed. In a "single well" CMOS manufacturing process, transistors of one of the conductivity types are formed into the substrate itself, which is doped to a concentration (and conductivity type) appropriate for the forming of those transistors. In "twin-well" processes, p-channel transistors are formed into n-wells, and n-channel transistors are formed into p-wells. Electrical connection to the body node of those transistors formed in a well is typically made by way of a conductor in the integrated circuit in contact with a doped region at the surface of that well. The doped region (of same conductivity type as the well) provides an ohmic contact between the conductor and the well. For the example of cell $30_{jk}$ of FIG. 4, node $V_{nwell}$ is connected to the body nodes of transistors 33a, 33b by way of such an n-well contact. Of course, connection between the body node of transistors 3a, 3b of conventional cell 2 of FIG. 1a, and the source nodes of those transistors, is made in a similar manner (i.e., by way of a conductor making contact to the surface of the n-well within which those devices are formed), but with the conductor also in electrical contact with power supply voltage $V_{dda}$ as indicated by the schematic diagram of FIG. 1a. Similarly, the body nodes of n-channel transistors 34a, 34b, 35a, 35b are connected to ground voltage $V_{ssa}$ by way of a p-well contact.

Figure 5B:
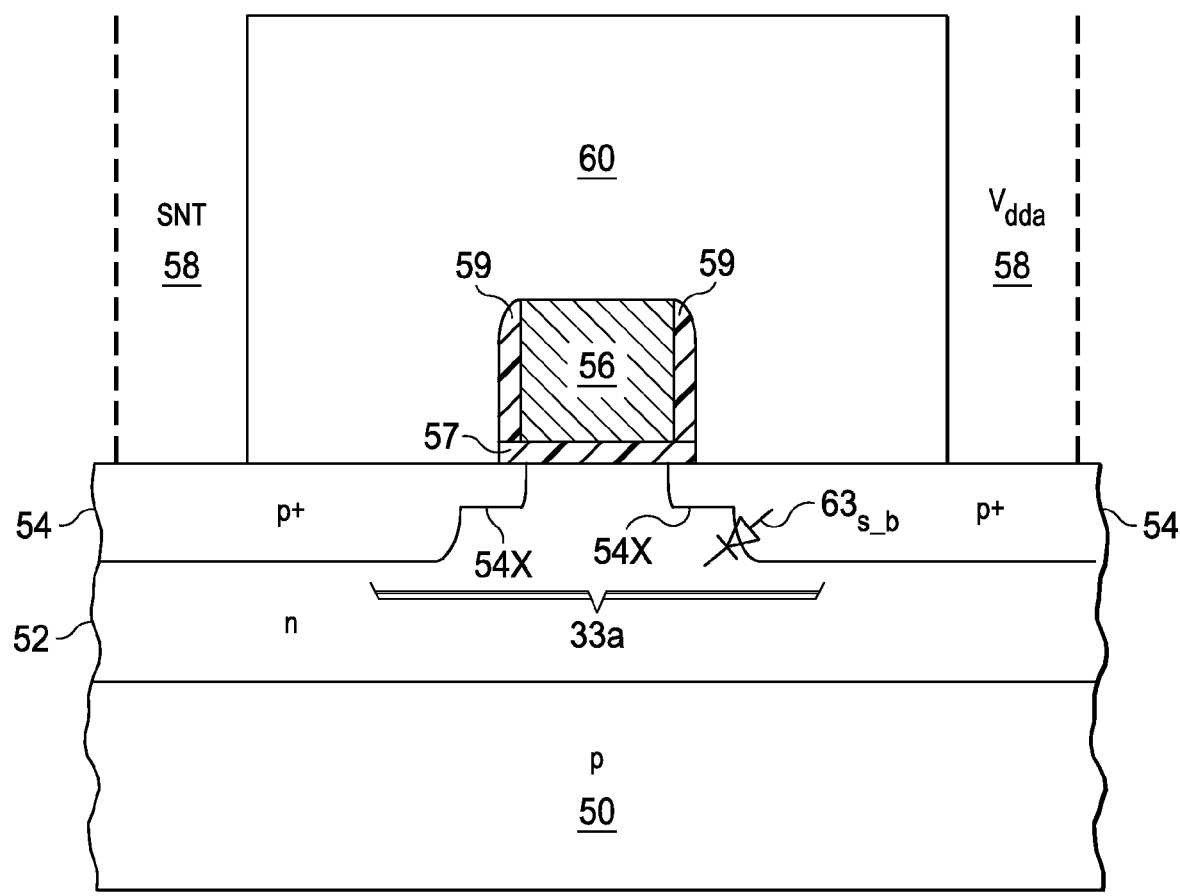

FIGS. 5a and 5b illustrate the plan layout view, and a cross-sectional view, respectively of an implementation of cell $30_{jk}$ at the surface of a silicon substrate, fabricated according to a "single-well" CMOS technology, and at a stage in the manufacture prior to the formation of overlying metal layers. In this example, cell $30_{jk}$ is formed into a region of p-type substrate 50, into which n-well 52 has been formed by conventional methods. N-channel transistors 34a, 35a, are formed into one region of p-type substrate 50, and n-channel MOS transistors 34b, 35b are formed into another region of p-type substrate 50; in a twin-well process, p-type wells would be formed at these substrate locations, to contain transistors 34a, 34b, 35a, 35b. P-channel MOS transistors 33a, 33b are formed into n-well 52, which in this example lies between the two regions of p-type substrate 50 in cell $30_{jk}$; as will become evident from the following description, adjacent cells 30 will be formed on all four sides of cell $30_{jk}$, such that n-well 52 and regions of substrate 50 can be shared from cell to cell. In the conventional manner, active regions 54 are defined at the surface, between isolation oxide structures 53 formed as LOCOS field oxide or as shallow trench isolation (STI) structures, also in the conventional manner. Gate elements 56 extend above the surface, overlying gate oxide 57 or isolation oxide 53, as the case may be. Gate elements 56 may be constructed of polycrystalline silicon or a metal (including metal alloys and conductive metal compounds) as appropriate for the manufacturing technology; the particular material of gate elements 56 is not contemplated to be of significance in connection with this invention. Active regions 54 within n-well 52 that are not underlying gate elements 56 will be p-type, and active regions 54 within regions of p-type substrate 50 that are not underlying gate elements 56 will be n-type. Contact openings 58 extend to active regions 54 or to gate elements 56, at the locations shown in FIG. 5a for this layout. Metal conductors (shown schematically in FIG. 5a) will overly the structure, making contact via respective contact openings 58.

FIG. 5a illustrates the outline of the various transistors 33, 34, 35 within cell $30_{jk}$, corresponding to the electrical schematic of FIG. 4. As is fundamental in the art, MOS transistors are located at regions of the surface at which a gate element 56 overlies an instance of active region 54. The metal conductors shown schematically in FIG. 5a interconnect these transistors according to the schematic of FIG. 4. In this example, a metal conductor connects storage node SNB from active region 54 at the drain of transistor 34b to active region 54 at the drain of transistor 33b and to gate element 56 serving as the gate of transistors 33a, 34a (via a shared contact opening 58). Similarly, a metal conductor connects storage node SNT from active region 54 between transistors 34a, 35a to active region 54 at the drain of transistor 33a, and (via shared contact opening 58) to gate element 56 serving as the gates of transistors 33b, 34b.

FIG. 5b illustrates, in cross-section, the construction of p-channel transistor 33a within n-well 52. In this cross-sectional view, n-well 52 extends into p-type substrate 50 by the desired depth, and constitutes a relatively lightly-doped n-type region at which transistor 33a is formed. Transistor 33a is a conventional self-aligned MOS transistor, with gate element 56 overlying gate dielectric 57 at the desired location of the surface of n-well 52, to serve as the gate of transistor 33a. P-type source/drain regions 54 are formed into n-well 52 on opposing sides of gate element 56, by way of ion implantation and high temperature anneal, in the conventional self-aligned manner. In this example, sidewall dielectric elements 59 were formed on the sides of gate element 56 after a first lightly-doped implant, and prior to a heavier source/drain implant, such that lightly-doped extensions 54x are formed immediately adjacent to the eventual transistor channel, thus providing a pseudo-graded junction, as conventional in the art. Planarizing dielectric layer 60 is disposed over this structure, in the conventional manner, through which contact openings 58 are etched to enable overlying metal conductors to make contact to active regions 54 at the desired locations.

FIG. 5a schematically illustrates an example of electrical contact to n-well 52, as may be used in connection with embodiments of the invention. As mentioned above, additional cells 30 will be formed adjacent to cell $30_{jk}$, for example in an aligned manner extending in the horizontal direction of that FIG. 5a. P-channel transistors 33a, 33b in each cell 30 of the same physical row can share a single instance of n-well 52. As such, a single contact $58_{nwell}$ may be placed at some location within that n-well 52, within n-type doped region $54_{nwell}$ as shown in FIG. 5a, to provide bias throughout that instance of n-well 52. Of course, additional contacts $58_{nwell}$ may be placed as appropriate for ensuring that the body node bias is constant throughout n-well 52, and as permitted by the layout. Other instances of n-well 52 for other cells in array 20 will, of course, require their own electrical contact.

For purposes of carrying out certain tests according to embodiments of this invention, n-type doped region $54_{nwell}$ is in electrical contact with pad $55_{Vnwell}$, by way of a corresponding metal conductor (shown schematically in FIG. 5a). This pad $55_{Vnwell}$ allows automatic test equipment to make electrical contact to n-well 52 via this connection, enabling application of the desired voltage to n-well 52 via n-well contact $58_{nwell}$, and thus to the body nodes of p-channel MOS transistors 33a, 33b in those cells 30. This electrical contact during test is especially useful with RAM 18 (i.e., integrated circuit 10 containing RAM 18) in wafer form, as pad $55_{Vnwell}$ can be readily contacted with a separate probe PRB that applies the desired back-bias voltage. "Repair" of failing cells 30 in RAM 18 by way of redundant array 20R can be readily carried out while in wafer form. Pad $55_{Vnwell}$ can be wire-bonded to a pad for receiving power supply voltage $V_{dda}$ in packaging of integrated circuit 10, or some other circuit or physical connection of n-well 52 to a conductor for carrying power supply voltage $V_{dda}$ can be alternatively utilized.

Figure 1B:
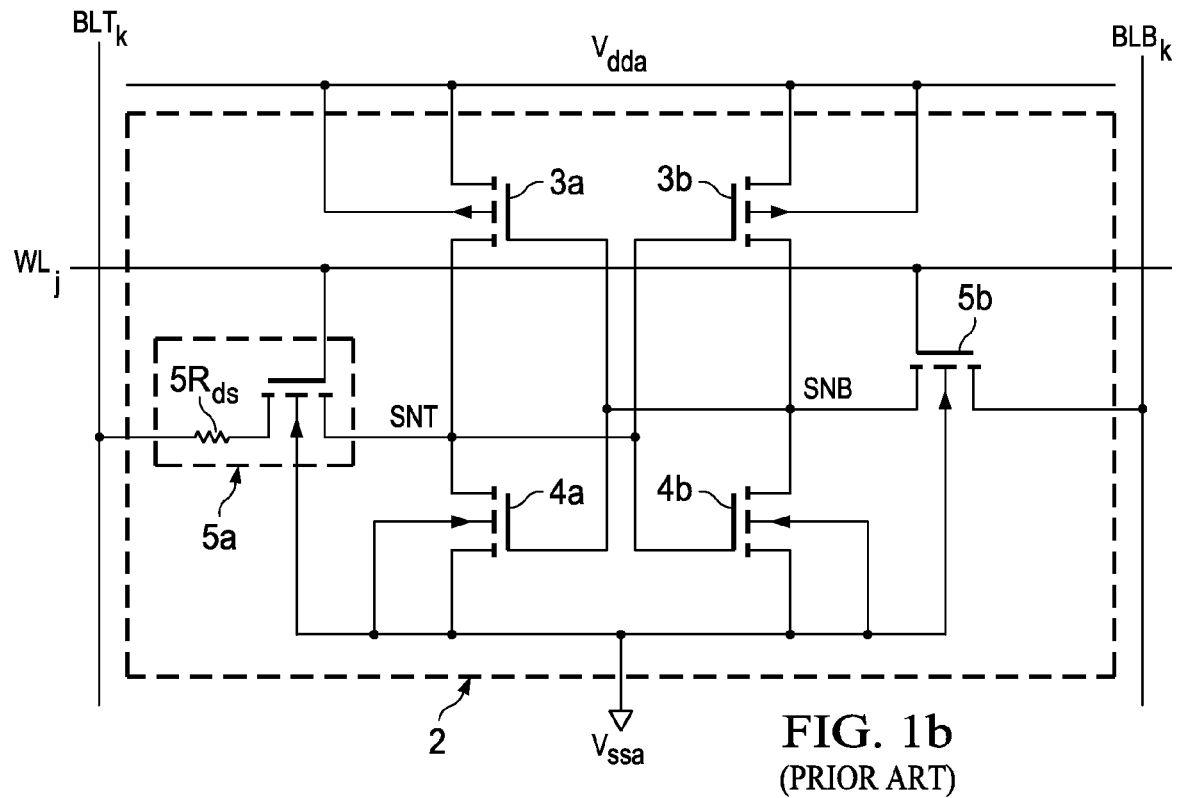
FIG. 1b is an electrical diagram, in schematic form, of the conventional SRAM cell of FIG. 1a illustrating the electrical effect of a bit line side defect at one of its pass transistors.

As mentioned above, accelerated operating life tests of SRAM memory arrays have exhibited early life write failures in some memory cells. Those early life failures passed conventional manufacturing tests directed to evaluation of write margin, even with the application of worst case write bias conditions including guardbanding for degradation over time. As discussed above in connection with FIG. 1b, it has been observed, according to this invention, that memory cells with defects on the bit line side of the pass transistor can pass such conventional write margin screening, yet can still exhibit the early life write failure after even a modest degradation in transistor characteristics. One type of bit line side pass transistor defect has been observed to be the absence of a lightly-doped drain extension on the bit line side of pass transistors 15a, 15b (such extensions similar to extensions 54Xx shown in FIG. 5b for transistor 33a).

Figure 6:
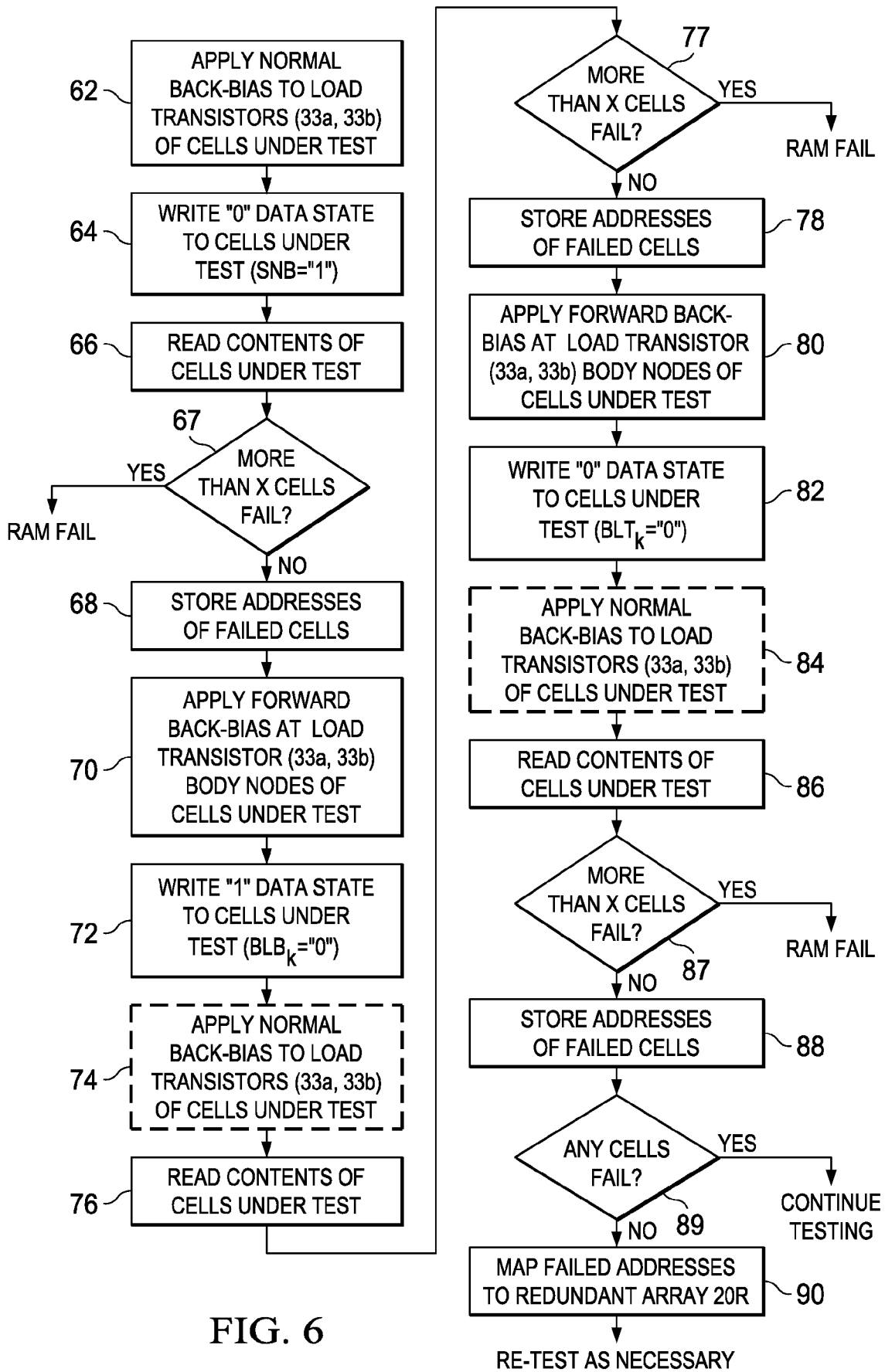
FIG. 6 is a flow diagram illustrating a method of testing the memory of FIG. 3, according to embodiments of the invention.

Referring now to FIG. 6, a method of testing cells $30_{jk}$ including a screen for early life write failures due to bit line side pass transistor defects, according to an embodiment of the invention, will now be described. It is contemplated that the method of FIG. 6 will typically be performed by way of automated test equipment, for example automated test equipment as used in functionally testing integrated circuits 10, containing one or more instances of RAM 18, while in wafer form (i.e., "multiprobe" functional testing). Of course, screening for early life failures according to embodiments of this invention may alternatively, or additionally, be performed at other stages in the manufacturing process, such as after packaging, system evaluation or burn-in, and the like.

The method of FIG. 6 will be described in connection with the testing of a population of memory cells, for example the testing of array 20 of RAM 18 of FIG. 3. It is contemplated that the particular test sequence may alternatively be applied fully to each memory cell in sequence (i.e., the entire test sequence performed for each cell $30_{jk}$ in turn). Alternatively, the test sequence may be applied to cells $30_{jk}$ in a row, column, or sub-array of array 20, or to some other population smaller than the entire array 20, such as a redundancy domain (i.e., a region of array 20 that is associated with its own redundant array 20R). As such, the method described below in connection with FIG. 6 will refer to a population of cells 30 under test, it being understood that the number of cells 30 in that population can number from one to the entire array 20. It is contemplated that those skilled in the art having reference to this specification will be readily able to apply the test sequence of FIG. 6 to the appropriate number of memory cells 30 for specific memory architectures.

The screening method of FIG. 6 begins with process 62, in which a normal back-bias is applied to the body nodes of the load transistors of cells 30 under test. Under this normal back-bias condition (also referred to as "zero back-bias"), the body node voltage is equal to the source node voltage for the load transistors. For cell $30_{jk}$ of FIGS. 4, 5a and 5b, in which load transistors 33a, 33b are p-channel transistors, bias process 62 will apply power supply voltage $V_{dda}$ to n-well 52 (e.g., by way of probe PRB driven by automated test equipment), establishing this normal ("zero") back-bias condition. This back-bias condition is the same as that during normal operation of RAM 18. If normal back-bias has been applied to RAM 18 during functional testing performed prior to the portion of the manufacturing test shown in FIG. 6, process 62 may simply maintain that prior bias condition.

In process 64, the automated test equipment writes a "0" data state to each cell 30 under test. Due to bias process 62, the write cycles of process 64 are effectively normal write cycles such as performed in normal operation or conventional manufacturing test operations. For cell $30_{jk}$, this "0" data state corresponds to a "0" level at storage node SNT and thus a "1" data state at storage node SNB. In that data state, load transistor 33a and driver transistor 34b are both off, and load transistor 33b and driver transistor 33b are both on. In process 64, cells 30 under test are each read in the conventional manner, under the bias condition of process 62 (i.e., normal back-bias), to confirm that the correct "0" data state was successfully written and is being retained in each of those cells 30. Decision 67 determines whether any of cells 30 under test fail the read of process 66 (i.e., whether any cells 30 are currently storing a "1" data state rather than the "0" data state written in process 64).

In this embodiment of the invention, as described above relative to FIG. 3, RAM 18 includes some number of redundant memory cells in redundant array 20R. As such, decision 67 determines whether the number of functional failures (i.e., cells 30 failing to exhibit the correct data state in the read of process 66) is greater than the number that can be replaced by enabling redundancy, assuming that the remainder of the screen process of FIG. 6 detects no further failures. If more than this number of cells 30 under test have failed (decision 67 is "yes"), this instance of RAM 18 is classified as a failed device. If fewer than this number of cells 30 failed read process 66 (decision 67 is "no"), then the memory addresses of those failing cells (if any) are stored in the memory of the automated test equipment, in process 68, and the screening process continues.

At this point in the screening process, all operable cells 30 under test are known to be storing a "0" data state. Process 70 is next performed, by way of which the load transistors in cells 30 under test are placed in a forward back-bias condition. For the case of p-channel load transistors, this forward back-bias condition corresponds to the body nodes being at a lower voltage than the source nodes in those load transistors. For the case of n-channel load transistors, this forward back-bias condition corresponds to the body nodes being at a higher voltage than the source nodes (typically at ground). In the example of cell $30_{jk}$ of FIGS. 4, 5a, and 5b, bias process 70 applies a voltage to n-well 52 that is below power supply voltage $V_{dda}$. This forward back-bias need not, and ought not, be of a magnitude greater than the turn-on voltage of the source junction in transistors 33a, 33b (e.g., 0.6 volts). For example, if power supply voltage $V_{dda}$ is at about 1.0 volts, an n-well voltage $V_{nwell}$ of about 0.90 volts may be applied in forward back-bias process 70.

Under this forward back-bias condition, the automated test equipment now writes the opposite "1" data state into each of cells 30 under test, in process 72. Other bias voltages applied during write process 72 may be at their normal write bias and logic levels. Alternatively, one or more guardband voltages may be applied in write process 72, for example, write voltages at a guardband level above ground may be applied to bit lines $BLT_k$, $BLB_k$, power supply voltage $V_{dda}$ may be reduced, etc.

The effect of bias process 72 on a cell 30 under test, which is storing the opposite data state, is to strengthen the drive of the one of load transistors 33a, 33b that is in its on state. Referring to FIG. 4, and as mentioned above, the stored "1" state in cell $30_{jk}$ is maintained by load transistor 33b in its on state; the forward back-bias of its body-to-source junction applied in process 70 serves to strengthen the drive of load transistor 33b, by effectively lowering its transistor threshold voltage. In this example, the write of a "1" data state to cell $30_{jk}$ is accomplished by the corresponding read/write circuit 24 (FIG. 3) driving a low logic level at bit line $BLB_k$ (with bit line $BLT_k$ not driven, and remaining at its precharged voltage), in combination with row decoder 25 energizing (i.e., driving to a high logic level) word line $WL_j$ for row j containing cell $30_{jk}$, which turns on pass transistors 35a, 35b. Typically, word line $WL_j$ will be energized after the driving of bit line $BLT_k$ or $BLB_k$, as the case may be, in the write cycle. This write of the "1" data state will trip the state of cell $30_{jk}$, so long as the drive of pass transistor 35b is sufficient to overcome the drive of load transistor 33b, as enhanced by the forward back-bias applied in process 70. It has been observed, according to this invention, that a sufficiently large defect on the bit line side of pass transistor 35b can inhibit pass transistor 35b from applying sufficient drive under this forward back-bias condition, in which case the write will fail (i.e., the voltage at storage node SNB of cell $30_{jk}$ does not reach the trip voltage).

Upon completion of write process 72 for all cells 30 under test, the automated test equipment can optionally return the body node bias of the load transistors in cells 30 under test to the normal back-bias (i.e., zero back-bias) condition, in process 74. For the example of cell $30_{jk}$ of FIGS. 4 et seq., process 74 biases n-well 52 to power supply voltage $V_{dda}$. Other bias voltages applied to array 20 can be changed in process 74 as well, so that RAM 18 is placed in a normal or nominal operating bias condition. Alternatively, if the forward back-bias condition does not significantly affect the readability of cells 30, process 74 can be omitted to save test time. In process 76, the contents of cells 30 under test are read, specifically to determine whether each of those cells 30 was successfully written with a "1" data state in process 72 while under the forward back-bias applied in process 70.

In decision 77, the automated test equipment determines whether the number of cells 30 under test that did not return a "1" data state in process 76 (if any) exceed the number that can be replaced by way of redundancy. The number of repairable cells may take into account those cells 30 that failed the functional test of process 66, if any, as those failed cells 30 also require replacement. If the repair limit is exceeded (decision 77 is "yes"), RAM 18 is identified as failing the screen. If not (decision 77 is "no"), then the memory addresses of failing cells 30 identified in process 76 are stored in the memory of the automated test equipment, in process 78.

The read of process 76 confirms that the contents of cells 30 under test (other than the failed cells) store the "1" data state written in process 72. According to this embodiment of the invention, these cells 30 are then tested for writes to the opposite data state. In process 80, the automated test equipment again applies a forward back-bias at the body nodes of the load transistors in cells 30 under test, in similar manner and under similar bias conditions as applied in process 70. If normal back-bias process 74 was omitted, process 80 is not necessary. As before, the forward back-bias condition strengthens the drive of the one of load transistors 33a, 33b that is in its on state, by lowering its transistor threshold voltage. In this stage of the screen process, the stored "0" state in cell $30_{jk}$ is maintained by load transistor 33a in its on state, while load transistor 33b is turned off in this data state.

In process 82, with cells 30 under test in this forward back-bias condition, the automated test equipment writes the "0" data state to each of cells 30 under test. In this example, the write of a "0" data state to cell $30_{jk}$ is accomplished by a low logic level driven at bit line $BLT_k$, in combination with word line $WL_j$ for row j driven high to turn on pass transistors 35a, 35b. For the writing of this "0" data state in process 82, bit line $BLB_k$ remains at its precharged voltage. For the write of this "0" data state to trip the state of cell $30_{jk}$, the drive of pass transistor 35a must overcome the drive of load transistor 33a, as enhanced by the forward back-bias condition applied in process 80 (or as applied in process 70 if normal back-bias process 74 is omitted). A bit line side defect in pass transistor 35a will inhibit the write of the "0" data state under these conditions.

In process 84, the automated test equipment returns the body node bias of the load transistors in cells 30 under test to the normal back-bias condition as in process 74, by biasing n-well 52 to power supply voltage $V_{dda}$. Alternatively, if it is contemplated that the forward back-bias condition does not degrade cell readability, process 84 can be omitted. In process 86, the contents of cells 30 under test are read, specifically to determine whether each of those cells 30 was successfully written with a "0" data state in process 82 despite the forward back-bias applied to the cell load transistors in process 80. Decision 87 determines whether the number of cells 30 under test that did not return a "0" data state in the read of process 86 (if any) exceeds the number that can be replaced by way of redundancy, taking into account any such cells 30 having previously failed the reads of process 66, 76. Again, if the repair limit is exceeded (decision 87 is "yes"), RAM 18 is identified as failing the screen. But if fewer than the repairable limit (decision 87 is "no"), the memory addresses of those cells 30 identified as failing the read of process 86 are stored in memory, in process 88.

The enhanced screen for early life write failures, by way of the forward back-bias condition at the load transistors in cells 30 under test, is then complete. If the automated test equipment then determines, in decision 89, that none of the cells 30 under test failed any of the tests of read processes 66, 76, 86 (decision 89 is "no"), then RAM 18 is identified as having passed this enhanced screen. Any such functional or parametric testing remaining to be performed can then be carried out on RAM 18 and the remainder of integrated circuit 10, depending on the desired test sequence and the functionality of integrated circuit 10. If one or more cells 30 under test were identified as failing a read during the sequence of FIG. 6 (decision 89 is "yes"), the automated test equipment retrieves the stored memory addresses of those cells, and programs redundant mapping circuit 35 (FIG. 3) to map cells in redundant array 20R of RAM 18 to "replace" those failed memory addresses, in process 90. Upon completion of mapping process 90, continued testing of RAM 18 and integrated circuit 10 continues, including any necessary re-testing of those cells of redundant array 20R (including performing the screen of FIG. 6 to determine whether any such redundant cells are vulnerable to early life failure.

According to embodiments of this invention, the effect of bit line side defects in pass transistors of read/write memory cells can be successfully and efficiently screened during a manufacturing test. In addition, it has been observed that applying forward back-bias to the "on" state transistor holding the opposite data state from that applied by the bit line does not greatly affect the operation of a healthy memory cell in a write operation, but does affect the writeability of memory cells with bit line side pass transistor defects. In other words, it has been observed that a physical defect that electrically appears as a resistance between an SRAM cell pass transistor and its bit line, as described above in connection with FIG. 1b, exhibits a much weaker write drive when trying to overcome the drive of its opposing load transistor under forward back-bias; that weaker drive is not exhibited to that extent if the opposing load transistor is under normal or zero back-bias, even under stringent worst case write conditions. As a result, the forward back-bias of that load transistor unexpectedly impacts the writeability of memory cells having such bit line side defects, enabling a time-zero manufacturing screen to identify likely early life write failures. Such defective cells can thus be readily repaired by way of redundancy, if available, or the integrated circuit removed from the population. In addition, the screen according to embodiments of this invention has not been observed to over-screen memory cells and memories that do not have the defect, and as such does not result in undue yield loss.

Of course, various alternatives to the particular screening method of FIG. 6 will be apparent to those skilled in the art having reference to this specification.

These alternatives include, among others, alternative data patterns (e.g., checkerboard, disturb patterns, etc.) that are applied to the cells under test during this sequence, variations in the body node bias voltages to characterize or sort weak cells, and the like. According to other alternatives, forward back-bias of the n-channel driver transistors (rather than the load transistors) may be applied in such a screen, particularly if the write drivers are driving a high level onto the storage node to be set as a "1" state. Further in the alternative, the various biases may be further adjusted depending on the construction of the memory cells, for example if p-channel transistors are used as the pass transistors, or in the case of 8-T or 10-T cells. It is contemplated that these, and other, alternatives and variations to the embodiments of the invention described herein are within the scope of the invention as claimed.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of testing a solid-state read/write memory cell, the memory cell comprising a first inverter comprised of complementary load and driver transistors having their drains connected together at a first storage node and having their gates connected together, the memory cell further comprising a first pass transistor having a source/drain path connected between the first storage node and a first bit line, and having a gate receiving a word line signal, the method comprising:
   with the first storage node at a first logic level so that the load transistor of the first inverter is in an on state, applying a forward back-bias voltage to a load transistor of the first inverter;
   then placing a second logic level at the first bit line and energizing the word line signal;
   then de-energizing the word line signal; and
   then reading the memory cell.

2. The method of claim 1, further comprising:
   after the de-energizing step, applying a normal back-bias voltage to the load transistor of the first inverter.

3. The method of claim 1, wherein the memory cell further comprises a second inverter comprised of complementary load and driver transistors having their drains connected together at a second storage node and to the gates of the first inverter, and having their gates connected together and to the first storage node, the memory cell further comprising a second pass transistor having a source/drain path connected between the second storage node and a second bit line, and having a gate receiving the word line signal;
   wherein the method further comprises:
      with the second storage node at the first logic level so that the load transistor of the second inverter is in an on state, applying a forward back-bias voltage to the load transistor of the second inverter;
      then placing the second logic level at the second bit line and energizing the word line signal;
      then de-energizing the word line signal; and
      then reading the memory cell.

4. The method of claim 3, further comprising:
   after the de-energizing step, applying a normal back-bias voltage to the load transistor of the second inverter.

5. The method of claim 1, wherein the load and driver transistors of the first inverter have their source/drain paths connected in series between a power supply voltage and a reference voltage;
   wherein the load transistor of the first inverter is a p-channel MOS transistor having its source node connected to the power supply voltage;
   wherein the driver transistor of the first inverter is an n-channel MOS transistor;
   and wherein the step of applying a forward back-bias voltage to the load transistor comprises:
      biasing the body node of the load transistor to a voltage below the power supply voltage.

6. The method of claim 5, wherein the first logic level is a high logic level; and wherein the second logic level is a low logic level.

7. The method of claim 5, wherein the step of placing a second logic level at the first bit line comprises:
biasing the first bit line to the reference voltage.

8. The method of claim 5, further comprising:
after the de-energizing step, applying a normal back-bias voltage to the load transistor by biasing the body node of the load transistor to the power supply voltage.

9. A method of testing an array of memory cells arranged in rows and columns, each column of memory cells associated with a first and second bit lines, each memory cell comprising first and second cross-coupled CMOS inverters with outputs driving first and second storage nodes, each inverter comprised of complementary load and driver transistors, each memory cell further comprising a first pass transistor with a source/drain path connected between the first storage node and the first bit line for its column, and a second pass transistor with a source/drain path connected between the second storage node and the second bit line for its column, the gates of the first and second pass transistors receiving a word line signal for its row, the method comprising, for each memory cell in the array:
writing the memory cell to a first logic state;
then applying a forward back-bias to each of the load transistors of the memory cell;
driving the first and second bit lines, for the column containing the memory cell, to voltages corresponding to the second logic state;
then energizing the word line signal for the row containing the memory cell;
then de-energizing the word line signal for the row containing the memory cell; and
then reading the memory cell to determine its logic state.

10. The method of claim 9, further comprising, for each memory cell in the array:
after the de-energizing step and before the reading step, applying a normal back-bias to each of the load transistors of the memory cell.

11. The method of claim 9, further comprising, for each memory cell in the array:
writing the memory cell to the second logic state;
then biasing the body node of each of the load transistors of the memory cell to forward-bias its body-to-source junction;
driving the first and second bit lines, for the column containing the memory cell, to voltages corresponding to the first logic state;
then energizing the word line signal for the row containing the memory cell;
then de-energizing the word line signal for the row containing the memory cell; and
then reading the memory cell to determine its logic state.

12. The method of claim 11, further comprising:
after the de-energizing step and before the reading step, applying a normal back-bias to each of the load transistors of the memory cell.

13. The method of claim 9, further comprising:
responsive to the reading step determining that the memory cell is storing the first logic state, storing the memory address of the memory cell.

14. The method of claim 13, wherein the array of memory cells includes memory cells corresponding to each address in a memory address space, and further includes redundant memory cells;
and wherein the method further comprises:
after the step of storing the memory address of the memory cell, mapping the stored memory address to one of the redundant memory cells of the array.

15. The method of claim 9, wherein the array of memory cells is located in one of a plurality of integrated circuits at a semiconducting surface of a wafer;
wherein the load transistors are formed within a well region of the semiconducting surface;
and wherein the step of applying a forward back-bias comprises:
contacting a probe to a body node contact of the well region; and
applying a voltage to the probe.

16. The method of claim 9, wherein the load and driver transistors of each memory cell have source/drain paths connected in series between a power supply voltage and a reference voltage;
wherein the load transistors are p-channel MOS transistors, each having its source node connected to the power supply voltage;
wherein the driver transistors are n-channel MOS transistor;
and wherein the step of applying a forward back-bias to each of the load transistors of the memory cell comprises:
biasing the body node of each load transistor to a voltage below the power supply voltage.

17. The method of claim 16, further comprising:
after the de-energizing step and before the reading step, biasing the body node of each load transistor to the power supply voltage.

18. The method of claim 16, wherein the first logic state corresponds to a high logic level at the first storage node and a low logic level at the second storage node, and wherein the second logic state corresponds to a low logic level at the first storage node and a high logic level at the second storage node;
wherein the step of driving the first and second bit lines to voltages corresponding to the second logic state comprises:
precharging the first and second bit lines to voltages about at the power supply voltage;
biasing the first bit line to the reference voltage.

19. The method of claim 18, further comprising, for each memory cell in the array:
writing the memory cell to the second logic state;
then applying a forward back-bias to each of the load transistors of the memory cell;
precharging the first and second bit lines to voltages about at the power supply voltage;
biasing the second bit line to the reference voltage;
then energizing the word line signal for the row containing the memory cell;
then de-energizing the word line signal for the row containing the memory cell; and
then reading the memory cell to determine its logic state.

20. The method of claim 19, further comprising, for each memory cell in the array:
after the de-energizing step and before the reading step, applying a normal back-bias to each of the load transistors of the memory cell.

* * * * *